United States Patent
Song

(10) Patent No.: US 6,469,646 B1
(45) Date of Patent: Oct. 22, 2002

(54) CONVERTING DIGITAL SIGNALS TO ANALOG SIGNALS

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/867,155

(22) Filed: May 29, 2001

(51) Int. Cl.[7] ............................................. H03M 1/66
(52) U.S. Cl. ................... 341/144; 341/145; 341/154
(58) Field of Search ........................ 341/136, 144, 341/145, 154, 118, 120, 153

(56) References Cited

U.S. PATENT DOCUMENTS

| | | | |
|---|---|---|---|
| 4,083,043 A | * 4/1978 | Breuer | 340/347 |
| 4,843,394 A | * 6/1989 | Linz et al. | 341/154 |
| 4,947,172 A | * 8/1990 | Suzuki | 341/145 |
| 5,075,677 A | * 12/1991 | Meaney et al. | 341/136 |
| 5,703,586 A | * 12/1997 | Tucholski | 341/144 |

* cited by examiner

Primary Examiner—Brian Young
Assistant Examiner—John Nguyen
(74) Attorney, Agent, or Firm—Trop, Pruner & Hu, P.C.

(57) ABSTRACT

A way of converting digital signals to analog signals is provided. An apparatus is provided that comprises a resistive-ladder array to convert a first portion of a digital input signal to a first analog output signal. The apparatus further includes a current-mode array to convert a second portion of the digital input signal to a second analog output signal.

23 Claims, 7 Drawing Sheets

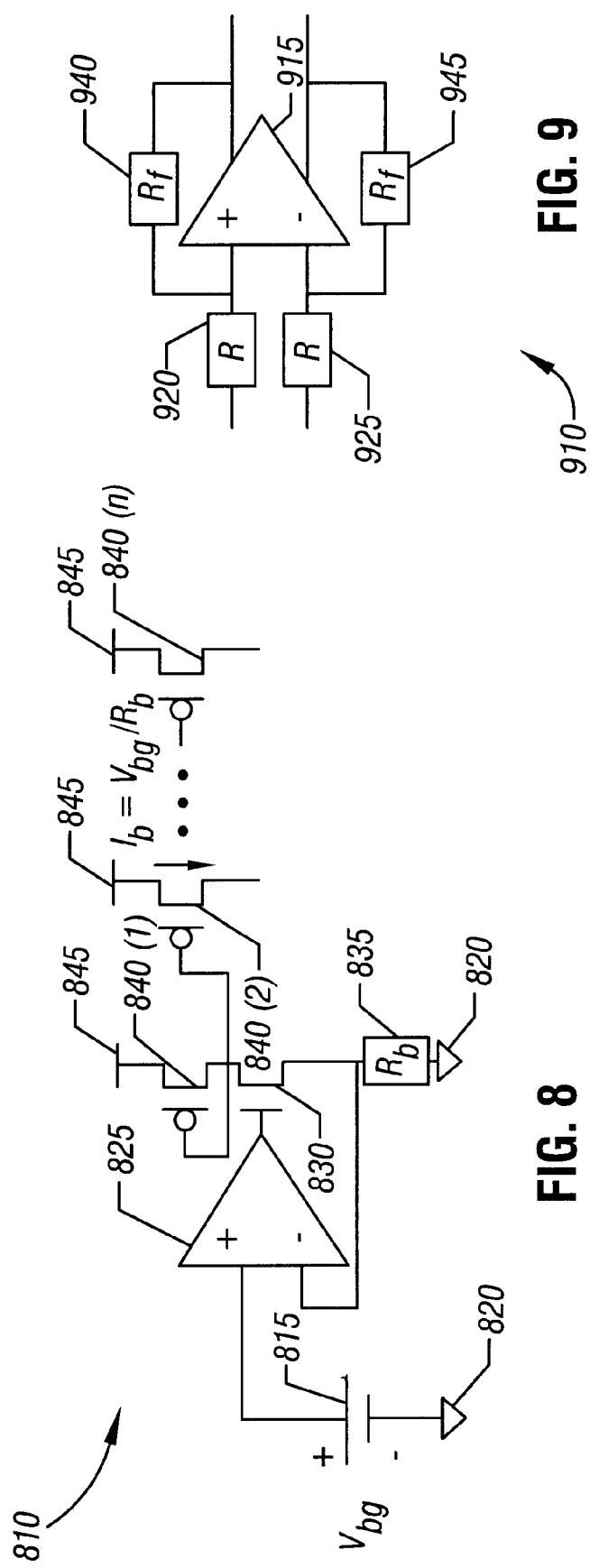

US 6,469,646 B1

CONVERTING DIGITAL SIGNALS TO ANALOG SIGNALS

BACKGROUND

This invention relates generally to converting digital signals to analog signals.

Digital-to-analog (D/A) converters may be utilized to convert digital data to an analog equivalent. D/A converters may be employed in various types of devices, such as computers, measuring instruments, communication equipment, and other processor-based devices.

Traditionally, matching performance of a certain type of circuit components employed in D/A converters has been the focus in improving the operational characteristics of such D/A converters. For example, good transistor matching may be desirable when designing current-mode D/A converters, good resistor matching may be desirable when designing R-2R D/A converters, and good capacitor matching may be desirable when designing switched capacitor D/A converters. The above-mentioned methods of improving D/A converters are generally effective in an environment involving well-defined process technology, but may not be so in an environment involving several uncertainties, such as when the architecture and circuit parameters of a device employing such a D/A converter are fluid and thus prone to changes. A slight change in the device's architecture, for example, may, in some instances, call for a redesign of the D/A converter that is employed by the device, thereby introducing possible delays in the production cycle of the device.

Thus, there is a need for a flexible way of converting digital signals to analog signals that may be employed in different architectures.

BRIEF DESCRIPTION OF THE DRAWINGS

The invention may be understood by reference to the following description taken in conjunction with the accompanying drawings, in which like reference numerals identify like elements, and in which:

FIG. 8 is one embodiment of a schematic diagram of a current reference generator that may be implemented in the digital-to-analog converter of FIG. 2;

FIG. 9 is one embodiment of a schematic diagram of an output buffer that may be implemented in the system of FIG. 1.

DETAILED DESCRIPTION

Figure 1:
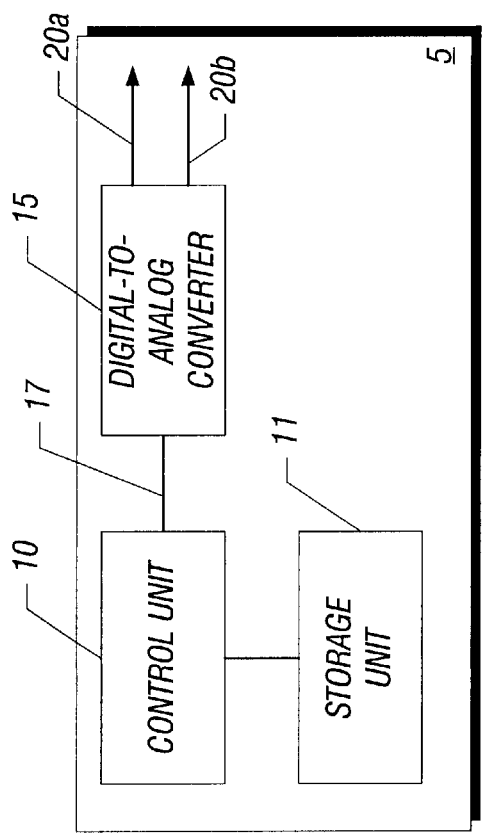
FIG. 1 is a stylized block diagram of a system employing a digital-to-analog converter, in accordance with one embodiment of the present invention.

Referring now to FIG. 1, a block diagram of a system 5 is illustrated, in accordance with one embodiment of the present invention. The system 5, in one embodiment, may be a telephone, such as a wireless telephone, a personal digital assistant, a processor-based system, or any other device in which converting digital signals to analog signals may be desirable.

The system, in one embodiment, includes a control unit 10 coupled to a storage unit 11. The storage unit 11, in one embodiment, may be one of a variety of forms of memory. The control unit 10, in one embodiment, may be communicatively coupled to a digital-to-analog converter (DAC) 15, in one embodiment over a line 17. In an alternative embodiment, the system 5 may include a modulator (not shown) or other elements between the control unit 10 and DAC 15, depending on the implementation. The output of the DAC 15 may be provided over lines 20a and 20b, wherein, in one embodiment, the two lines 20a, 20b carry signals that are complementary. In one embodiment, the DAC 15 may have a fully-differential structure. The DAC 15, the storage unit 11, and/or the control unit 10, which, for example, may be a digital signal processor that may be integrated in a single chip, in one embodiment.

Figure 2:
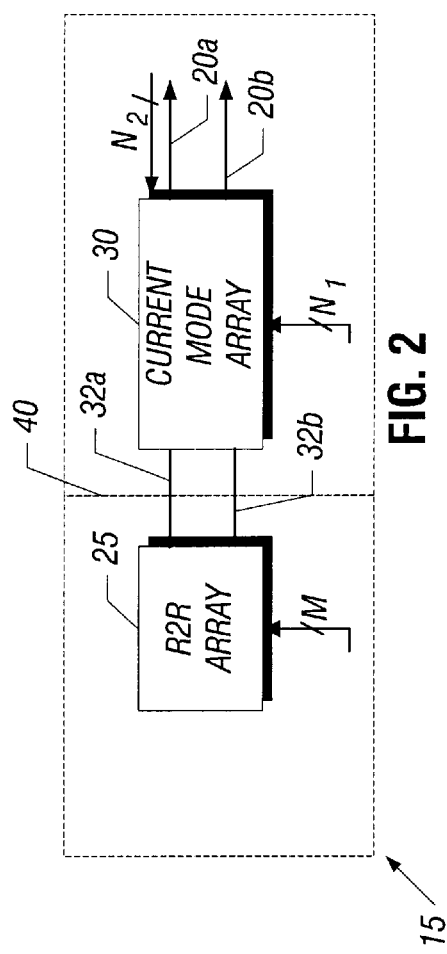
FIG. 2 is a block diagram of the digital-to-analog converter of FIG. 1 employing an R-2R array and a current-mode array, in accordance with one embodiment of the present invention.

Referring now to FIG. 2, a block diagram of the DAC (or the DAC architecture) that may be employed in the system 5 of FIG. 1 is illustrated, in accordance with one embodiment of the present invention. In one embodiment, the DAC 15 includes a R-2R array 25 communicatively coupled to current-mode array 30 by lines 32a and 32b. In accordance with one embodiment of the present invention, the architecture of the DAC 15 includes a re-configurable partitioning 40 between the R-2R and current-mode arrays 25, 30. In the illustrated DAC architecture, in one embodiment, the most significant bits (MSBs) of an input digital signal may be realized using the current-mode array 30, and the least significant bits (LSBs) may be realized using the R-2R array 25. Although the DAC 15 is illustrated having an R-2R array 25, in an alternative embodiment other resistive-array configurations may be employed.

In one embodiment, the architecture of the DAC 15 may be able to take advantage of both the current-mode and R-2R DAC architectures. The R-2R DAC 25, for example, may be used to realize M LSBs, while the current-mode DAC 30 may be utilized to realize N MSBs. The R-2R DACs tend to be relatively smaller and less accurate than, for example, current-mode DACs, which may be larger but more accurate than the R-2R DACs. Thus, in one embodiment, a desirable comprise between accuracy and size may be achieved such that the LSBs may be realized using the R-2R DAC 25 and the MSBs using the current-mode DAC 30. In one embodiment, the architecture of the DAC 15 may result in improved differential nonlinearity (DNL) and integral nonlinearity (INL), reduced layout area, and less power consumption.

Figure 3:
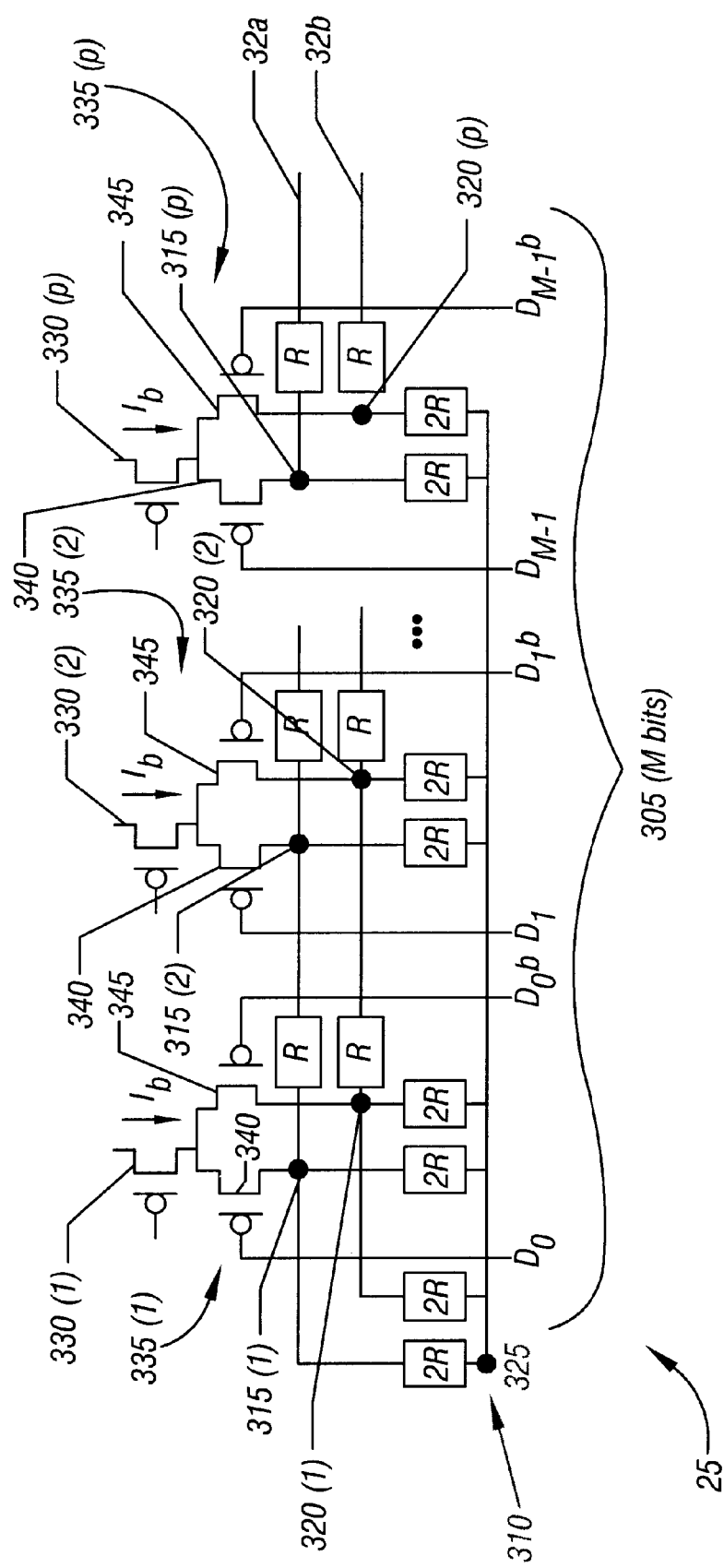
FIG. 3 is one embodiment of a schematic diagram of the R-2R array of the digital-to-analog converter of FIG. 2.

Referring now to FIG. 3, one embodiment of a structure of the R-2R array 25 of FIG. 2 is illustrated. In one embodiment, the R-2R array 25 is a one-dimensional R-2R array. The R-2R array 25, in one embodiment, is capable of receiving a M-bit digital input signal 305 and converting it to an analog signal. Accordingly, the R-2R array 25, in one embodiment, includes a M-bit R-2R ladder 310 comprising one or more series arms and shunt arms to provide an analog output signal on the lines 32a, 32b. In one embodiment, each series resistance R is disposed between each successive pair of nodes 315(1), 315(2); 315(2), 315(3), and so forth of the R-2R ladder 310. Similarly series resistance R, in one embodiment, is displayed between each successive pair of nodes 320(1), 320(2); 320(2), 320(3), and so forth of the R-2R ladder 310. In one embodiment, as shown, each shunt resistance 2R is connected between nodes 315(1–p) and a node 325 or nodes 320(1–p) and the node 325.

The R-2R array 310, in one embodiment, includes a drain terminal of one or more transistors 330(1–p) coupled to one or more switches 335(1–p). A reference or bias current, $I_b$, may be provided to each of the switches 335(1–p) through the respective transistors 330(1–p). Although not so limited, in the illustrated embodiment, each switch 335(1–p) comprises two transistors 340, 345, where a source terminal of the transistors 340, 345 is coupled to each other. A gate terminal of each transistor 340, 345 of the switches 335(1–p) is adapted to receive a respective input bit, D, and a complimentary input bit, $D_b$. Thus, in one embodiment, the input bits (i.e., D and $D_b$) control the switches 335(1–p).

In one embodiment, input bit, $D_0$, may represent the MSB of the digital input signal provided to the R-2R array 25, and the input bit, $D_{M-1}$, may represent the LSB of the M-bit digital input signal. In one embodiment, the principle of operation of the R-2R array 25 includes the current flowing in the resistive network in a simple progression of powers of 2. Thus, with a rightward progression along the ladder, in one embodiment, the currents that flow in the shunt branches are respectively one half, one quarter (and so on) of the current entering the resistive ladder 310. The R-2R array 25, in one embodiment, is iterative, such that the equivalent resistance presented by the resistive ladder 310 to any node 315 is R. The R-2R array 25 thus, in one embodiment, receives M-bits of the input digital signal 305 and generates an analog output signal on the lines 32a and 32b.

Figure 4:
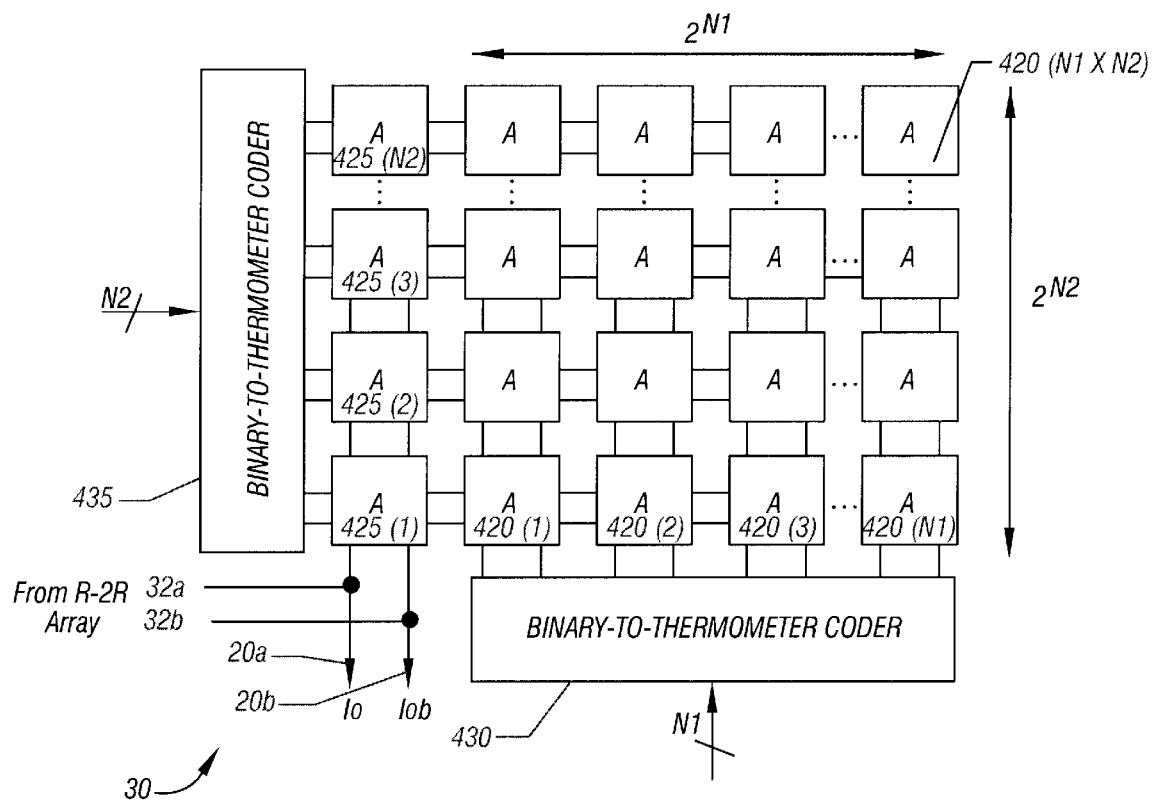
FIG. 4 is one embodiment of the current-mode array of the digital-to-analog converter of FIG. 2.

Referring now to FIG. 4, one embodiment of a schematic diagram of a structure of the current-mode array 30 of FIG. 2 is illustrated. The current-mode array 30, in one embodiment, is capable of converting N MSBs of the input digital signal to an analog output signal. The current-mode array 30, in one embodiment, includes a N1×N2 current array, which may comprise a plurality of column current cells (e.g., cells "A") 420(1–N1×N2) and a plurality of row current (e.g., cells "B") cells 425(1–N2).

The column cells 420(1–N1×N2) are adapted to receive decoded signals from a column binary-to-thermometer 430 and the row cells 425(1–N2) are adapted to receive decoded signals from a row binary-to-thermometer coder 435. The column binary-to-thermometer coder 430, in one embodiment, receives N1 bits of the MSBs of the input digital signal and generates a plurality of decoded signals that may be provided to the columns cells 420(1–N1×N2). The row binary-to-thermometer coder 435 receives, in one embodiment, N2 bits of the MSBs of the input digital signal and generates a plurality of decoded signals that may be applied to the row cells 425(1–N2).

In the illustrated embodiment, for a giving digital code, a selected number of rows and columns of the current-mode array 30 are turned ON. As the input digital code is incremented, in one embodiment, the current cells 425(1–N2) in the next row may be turned on sequentially. Thus, in one embodiment, the output of the current-mode array 30 may be a current weighted output, where the total current may depend on the number of currents cells 420(1–N1×N2) and 425(N2) are activated. The output of the current-mode array 30 may be provided on the lines 20a and 20b (see also FIG. 2). In one embodiment, the analog output signal from the R-2R array 25 (see FIG. 2) and the analog signal from the current-mode array 30 is provided on the lines 20a and 20b.

Figure 5:
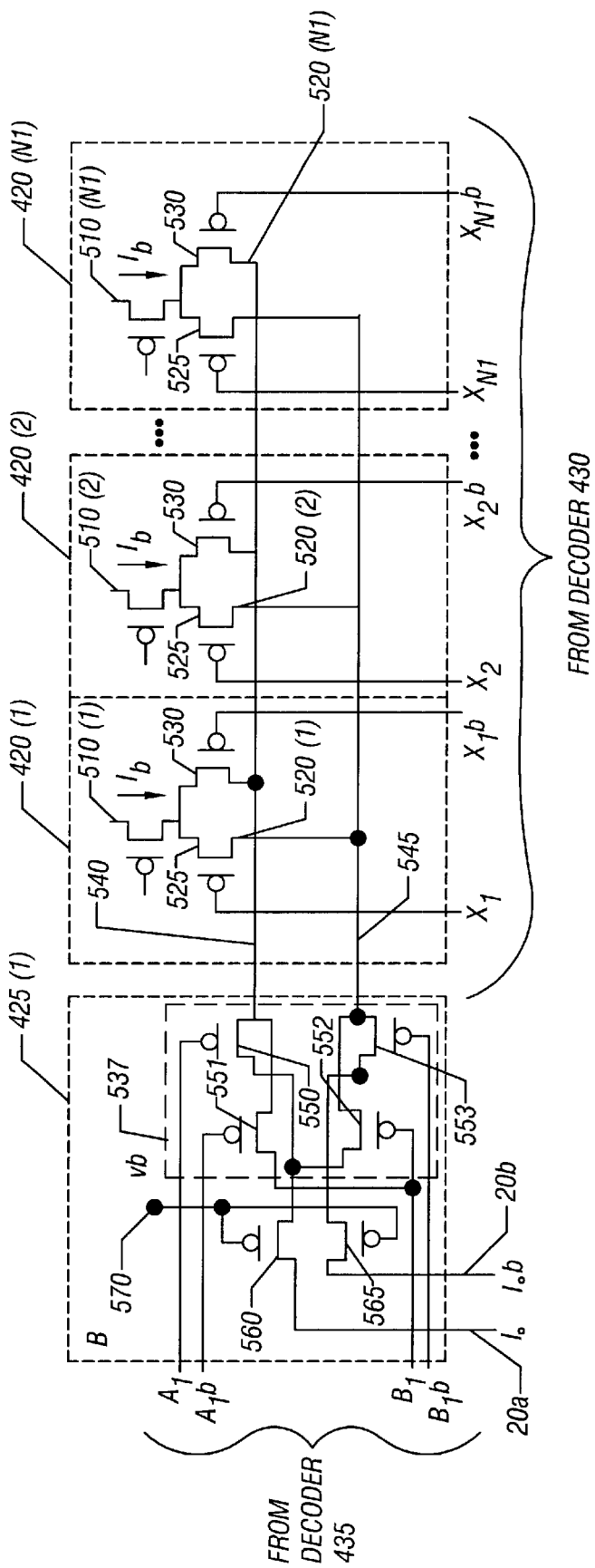
FIG. 5 is one embodiment of a schematic diagram of a switched current array cell structure that may be employed in the current-mode array of FIG. 4.

Referring now to FIG. 5, one embodiment of a schematic diagram of a switched current array cell structure 510 that may be implemented in the current-mode array 30 of FIG. 4 is illustrated. FIG. 5 illustrates a first row of current cells 420(1–N1) and 425(1) of the current-mode array 30. Each column cell 420(1–N1) of the first row includes a connection at transistors 510(1–N1), in one embodiment. The connection of transistors 510(1–N1), in one embodiment, effectively mirror a bias current, $I_b$, which is provided to a plurality of column switches 520(1–N1).

Each of the column switches 520(1–N1), in one embodiment, receives a decoded signal and a complementary decoded signal from the binary-to-thermometer coder 430.

Although not so limited, the switches 520(1–N1) in the illustrated embodiment includes a pair of transistors 525, 530. In the illustrated embodiment, the source terminals of the transistors are coupled to each other. A drain terminal of each of the transistors 510(1–N1) is coupled to the source terminals of each of the respective transistors 525, 530. A drain terminal of each transistor 525 of the column switches 520(1–N1) receive a decoded signal from the coder 430, and a drain terminal of each transistor of the column switches 520(1–N1) receive a complement of the decoded signal from the coder 430, in one embodiment.

A drain terminal of the transistor 525 of each of the switches 520(1–N1) is coupled to a row switch 537 of the row cell 425(1) over a line 540, in one embodiment. A drain terminal of the transistor 530 of each of the switches 520(1–N1) is coupled to the row switch 537 of the row cell 425(1) over a line 545.

The row switch 537 of the row cell 425, in one embodiment, receives decoded signals from the row decoder 435. Although not so limited, in the illustrated embodiment the row switch 537 includes four transistors 550-553. A gate terminal of the transistors 550, 551 of the switch 537 receives a decoded signal, $A_1$, and a complementary decoded signal, $A_{1b}$, respectively, from the row decoder 435, in one embodiment. A gate terminal of the transistors 552, 553 of the switch 537 receives a decoded signal, $B_1$, and a complementary decoded signal, $B_{1b}$, respectively, from the row decoder 435, in one embodiment. In the illustrated embodiment, the decoded signal, $A_1$, represents the current bit (nth bit) decoder output while the decoded signal, B, represents the next bit ((n+1)th bit) of the decoder output.

In one embodiment, a drain terminal of the transistor 550 is coupled to a source terminal of the transistor 551 of the row switch 537. A drain terminal of the transistor 551, in one embodiment, is adapted to receive the decoded signal, $B_1$, from the row decoder 435. A source terminal of the transistor 553 is coupled to a source terminal of the transistor 552, in one embodiment.

The row cell 425(1), in one embodiment, includes a pair of transistors 560, 565 substantially at the output of the row cell 425(1). In the illustrated embodiment, a gate terminal of both the first transistor 560 and the second transistor 565 is coupled to a voltage ($V_b$) node 570. Thus, in one embodiment, the transistors are ON when the voltage at node 570 is low, and are OFF when the voltage is high.

A source terminal of the first transistor 560, in one embodiment, is coupled to drain terminals of the transistors 550, 552 of the row switch 537 of the row cell 425(1). A source terminal of the second transistor 565, in one embodiment, is coupled to a drain terminal of the transistor 553 of the row switch 537.

The transistors 560, 566, in one embodiment, may reduce the switching noise by isolating charge spikes. This may be accomplished, in part, because the signal provided to the source and drain terminals of the switch transistors 550, 551, 552, and 553 is passed through the channel resistor of the transistors 560 and 565 substantially at the output terminals of the row cells 425(1-N2), thereby reducing the switching noise.

Figure 6:
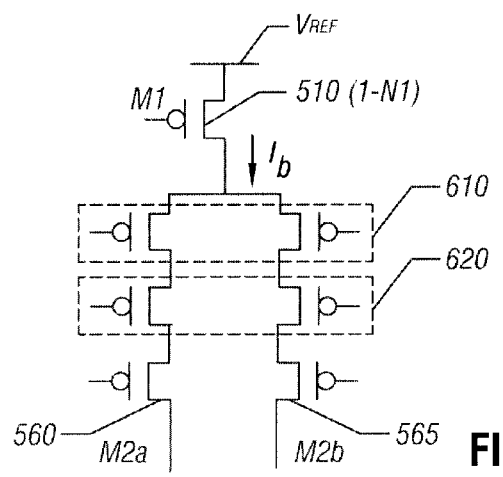
FIG. 6 is one embodiment of a current switching scheme that may be utilized in the current-mode array of FIG. 4.

Referring now to FIG. 6, one embodiment of a switching scheme that may be utilized to realize the current-mode array 30 of FIG. 4 is illustrated. The switching scheme, in one embodiment, includes a column switch 610 and a row switch 620 located between transistors 510(1–N1) and transistors 560 and 565. The row switch 610 and column switch 620 may be representative of the row and column switches of each current cell of the current-mode array 30 of FIG. 4. In one embodiment, the transistors 560 and 565 may aid in reducing the switching noise while the current-mode array 30 (see FIG. 4) is operational.

In one embodiment, the configuration of the current array cells 420(1–N1) and 425(1–N2) (see FIG. 5) may reduce the device counter that may be required to realize the two-dimensional current-mode array 30. For example, in an 8-bit array, which may call for a 256 column cells 420(1–N1) and 16 row cells 425(1–N2), by implementing the illustrated switching scheme and the cascade function in the row cell 425(1–N2) (as opposed to the column cell 420(1–N1), it may be possible to reduce the device counter required to realize the current-mode array 30.

Figure 7:
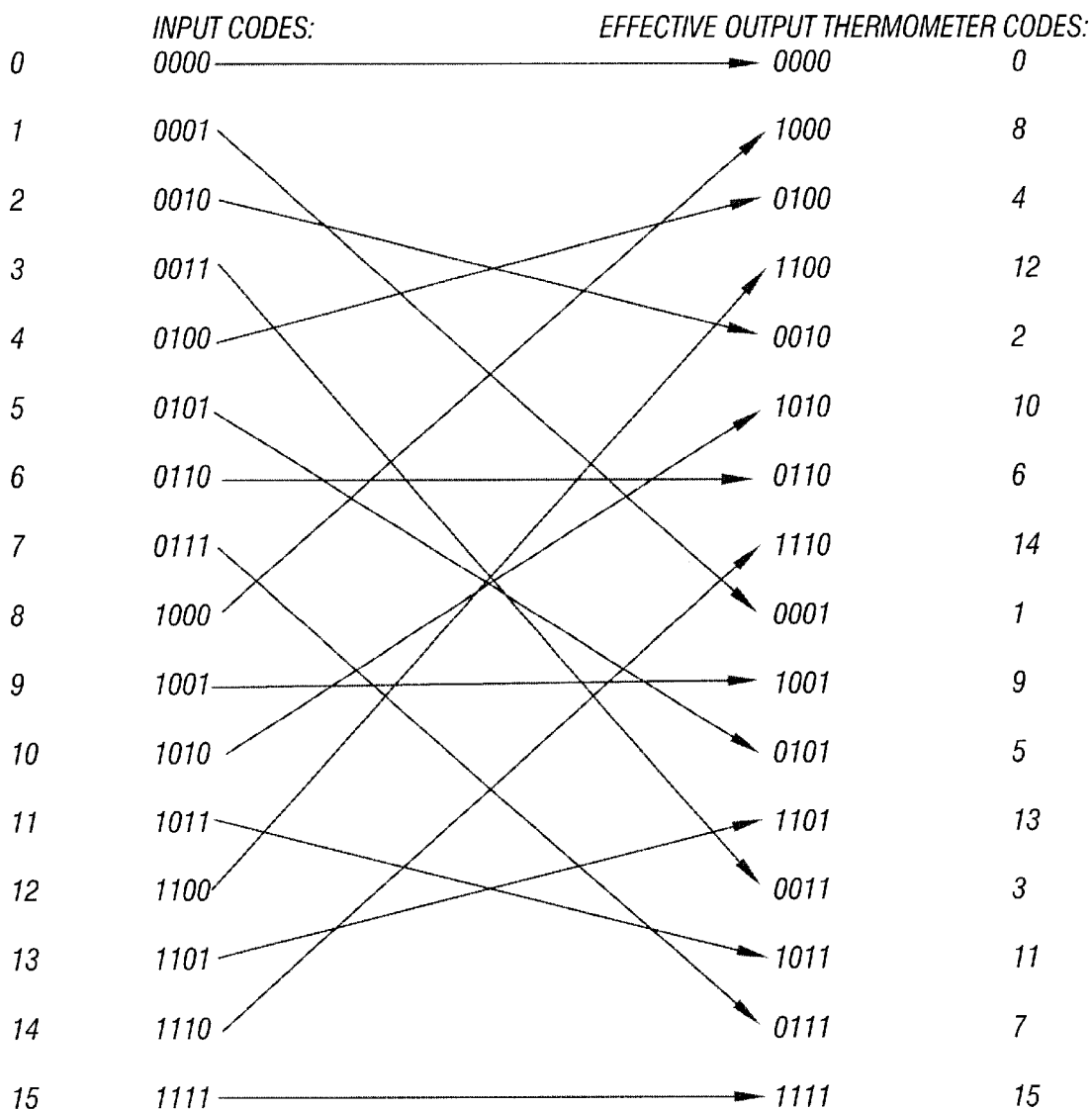
FIG. 7 is an example random coding scheme that may be employed by the current-mode cell array of FIG. 4.

Referring now to FIG. 7, a random coding scheme 710 that may be employed by the current-mode cell array 30 of FIG. 4 is illustrated. FIG. 7 illustrates an exemplary 4-bit pseudo-random coding scheme, although the illustrated scheme may be extended to converters with different resolution. The random coding scheme 710, in one embodiment, is a maximum distance coding scheme that randomizes the mismatch of the current cells 420(1–p). The random coding scheme 710 may improve the linearity of the DAC 15 (see FIG. 2).

As shown in the illustrative random coding scheme 710, an input code of "0000" may result in an output thermometer code of "0000," an input code of "0001" may result in an output thermometer code of "1000," an input code of "0010" may result in an output thermometer code of "0100," and so forth. Although not so limited, in the illustrated random coding scheme 710 the input and output bits are reversed. In alternative embodiments, other random coding schemes may be employed. The random coding scheme 710 may improve the linearity of the DAC 15 because it may provide space-domain mismatch shaping of the DAC implementation, and the mismatch effects of the device may be reduced.

Referring now to FIG. 8, one embodiment of a current reference generator 810 that may be employed to provide the bias current ($I_b$) to the R-2R cell array 25 and current-mode array 30 of the DAC 15 of FIG. 2 is illustrated. The current reference generator 810, in one embodiment, includes a voltage source 815 between a ground node 820 and a non-inverting terminal of an operational amplifier 825. An output terminal of the operational amplifier 825 may be coupled to a gate terminal of a transistor 830. A drain terminal of the transistor 830 may be coupled to an inverting terminal of the operational amplifier 825 through a feedback loop. The current reference generator 810, in one embodiment, includes a resistor 835 between the drain terminal of the transistor 830 and the ground node 820.

In one embodiment, the current reference generator 810 includes one or more transistors 840(1-n). A source terminal of the first transistor 840(1) is coupled to a reference voltage node 845 and a drain terminal of the first transistor 840(1) is coupled to a source terminal of the transistor 830, in one embodiment. In one embodiment, the bias current, $$I_b\left(\text{e.g.,}\ \frac{V_{815}}{R_{835}}\right)$$

flows through the first transistors 840(1), where the bias current may be mirrored to the transistors 840(2-n). A gate terminal of each transistor 840(1–(n–1)) is coupled to the gate terminal of the next transistor, and a source terminal of each transistor 840(1–n) is coupled to the voltage reference node 845. The bias current, $I_b$, from the transistors (2–n), in one embodiment, may be provided to respective cells of the R-2R array 25 and current-mode array 30 of the DAC 15 (see FIG. 2).

By providing the bias current to all of the cells of the DAC 15, the linearity, gain, and/or operation range of the DAC 15 may depend primarily on the matching of the components, thereby making it possible to achieve higher accuracy across PVT corners. The operating characteristics of transistors can change under a variety of circumstances. For example, these operating characteristics change with variations in operating conditions such as junction temperature and supply voltage levels. The operating characteristics may also change with variations in manufacturing process. The particular set of process, voltage and temperature parameters or conditions is referred to as a PVT corner.

Referring now to FIG. 9, one embodiment of an output buffer 910 that may be employed by the system 5 of FIG. 1 at the output of the DAC 15 is illustrated. The output buffer 910 includes an operational amplifier 915 having first terminals of first and second resistors 920, 925, coupled to respective non-inverting and inverting terminals of the operational amplifier 915. The second terminals of the resistors 920, 925 may be adapted to receive signals from the output lines 20a, 20b (see FIG. 1) of the DAC 15. The output buffer 910, in one embodiment, includes a first feedback resistor 940 between a first output terminal and the non-inverting terminal of the operational amplifier 915. The output buffer 910, in one embodiment, includes a second feedback resistor 945 between a second output terminal and the inverting terminal of the operational amplifier 915. The output buffer 910, in one embodiment, is capable of providing the system 5 (see FIG. 1) additional load driving capability.

Figure 10B:
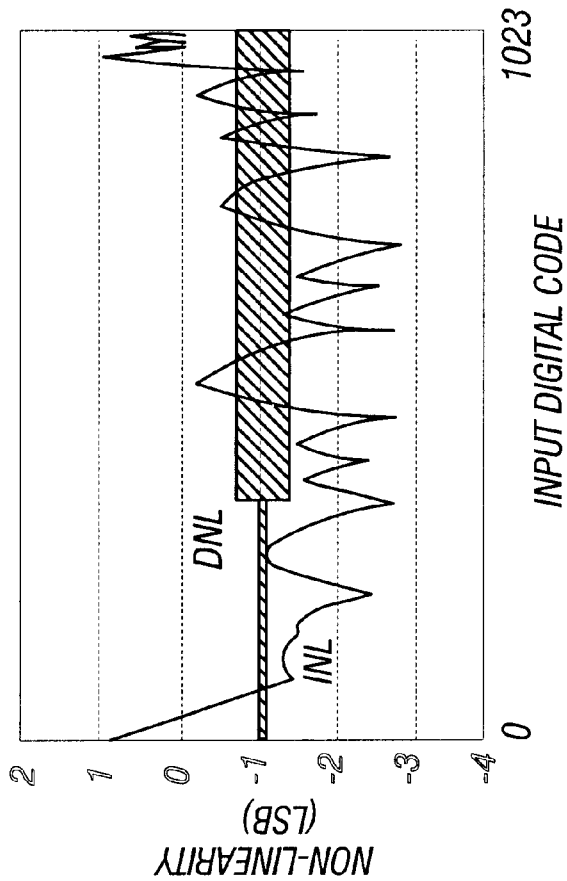
FIGS. 10A–10B illustrate an example of graphs contrasting the linearity of the current-mode array of FIG. 4.
Figure 10A:
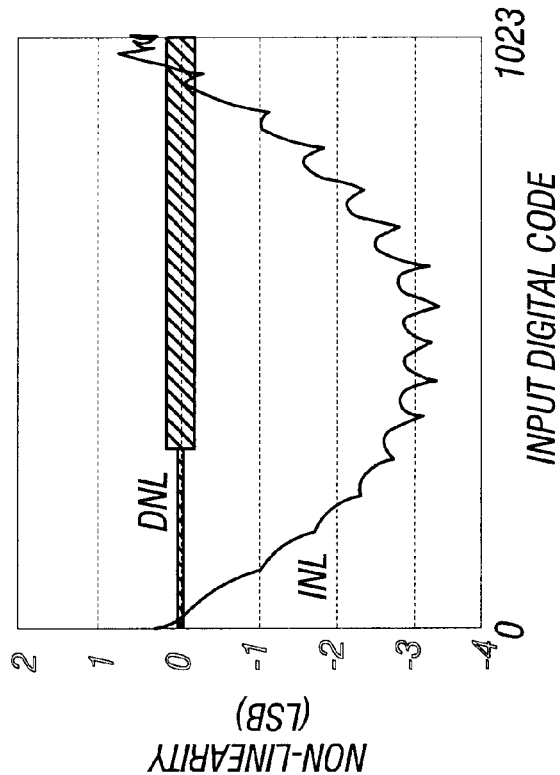

Referring now to FIGS. 10A and 10B, an example of graphs contrasting the linearity of the current-mode array 30 of FIG. 4 using a non-random and random coding is illustrated. Each graph illustrates an example of the overall INL and DNL of the DAC, where the x-axis represents the DAC input digital code and the y-axis represents the overall linearity of the DAC, measured using the LSB step as the unit.

Integral non-linearities typically result from errors produced in a conversion between analog and digital values over a wide range of values. Differential non-linearities typically result from errors produced in a conversion between analog and digital values over a relatively narrow range of such values.

In one embodiment, one or more of the above-described architectures of the digital-to-analog converter 15 (see FIG. 2) may improve tolerance to the current mismatch. Accordingly, the linearity, in one embodiment, of the DAC 15 may be improved using the random coding scheme 710 (see FIG. 7). In one embodiment, one or more of the above-described architectures of the digital-to-analog converter 15 may provide for a wide bandwidth with slightly higher reference current, which may make the digital-to-analog converter 15 an attractive option for a wide range of applications.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a resistive-ladder array to convert a first portion of a digital input signal to a first analog output signal; and
   a current-mode array to convert a second portion of the digital input signal to a second analog output signal.

2. The apparatus of claim 1, wherein the resistive-ladder array is an R-2R array.

3. The apparatus of claim 2, the digital input signal comprising one or more least significant bits and most significant bits, wherein the R-2R array converts the one or more of the least significant bits of the digital input signal.

4. The apparatus of claim 2, wherein the R-2R array is a differential R-2R array.

5. The apparatus of claim 3, wherein the current-mode array is a two-dimensional array.

6. The apparatus of claim 5, wherein the current-mode array converts the one or more of the most significant bits of the digital input signal.

7. The apparatus of claim 6, the current-mode array comprising a plurality of row cells and column cells, wherein at least one of the row cells comprises circuitry substantially at an output terminal to reduce noise.

8. The apparatus of claim 7, wherein the circuitry comprises one or more transistors.

9. The apparatus of claim 7, wherein the current-mode array comprises at least one decoder to provide decoded signals to at least one of the row cells and column cells, wherein the decoder employs a random coding scheme.

10. A method, comprising:
    converting a first portion of a digital input signal to an analog output signal using an R-2R array; and
    converting a second portion of the digital input signal to an analog output signal using a current-mode array.

11. The method of claim 10, wherein converting the first portion comprises converting one or more of the least significant bits of the digital input signal.

12. The method of claim 10, wherein converting the second portion comprises converting one or more of the most significant bits of the digital input signal.

13. The method of claim 12, wherein the current-mode array comprises a plurality of row and column current cells, further comprising reducing noise at an output of at least one row current cell.

14. The method of claim 13, wherein the current-mode array comprises a row decoder for providing decoded signals to the row current cells, further comprising using a random coding scheme in the row decoder to provided decoded signals.

15. The method of claim 14, wherein the current-mode array comprises a column decoder for providing decoded signals to the column current cells, further comprising using a random coding scheme in the row decoder to provided decoded signals.

16. An apparatus, comprising:
    an R-2R ladder to convert at least one of a least significant bit of an digital input signal to an analog signal; and
    a current-mode array to convert at least one a most significant bit of the digital input signal to an analog signal.

17. The apparatus of claim 16, wherein the current-mode array comprises at least one decoder to provide decoding signals to at least one of a row cell and column cell, wherein the decoder utilizes a random coding scheme to generate the decoding signals.

18. The apparatus of claim 17, wherein the row cell comprises circuitry substantially at an output terminal to reduce switching noise.

19. The apparatus of claim 17, wherein the current-mode array uses a maximum distance decoding scheme.

20. A system, comprising:
    a control unit; and
    a digital-to-analog converter communicatively coupled to the control unit, the digital-to-analog converter comprising a resistive-ladder array to convert a first portion of a digital input signal to a first analog output signal and a current-mode array to convert a second portion of the digital input signal to a second analog output signal.

21. The system of claim 20, the digital input signal comprising one or more least significant bits and most significant bits, wherein the digital-to-analog converter comprises an R-2R array to convert the one or more of the least significant bits of the digital input signal.

22. The system of claim 21, wherein the current-mode array converts the one or more of the most significant bits of the digital input signal.

23. The system of claim 20, wherein the current-mode array comprises a row decoder to provide decoded signals to one or more row current cells, wherein the decoder uses a random coding scheme to provide decoded signals to the row of current cells.

* * * * *

UNITED STATES PATENT AND TRADEMARK OFFICE
CERTIFICATE OF CORRECTION

PATENT NO. : 6,469,646 B1
DATED : October 22, 2002
INVENTOR(S) : Hongjiang Song

It is certified that error appears in the above-identified patent and that said Letters Patent is hereby corrected as shown below:

Column 7,
Line 18, delete "first" and insert therefor -- least significant --;
Line 20, delete "second" and insert therefor -- most significant --;
Line 21, after "signal", insert -- without using the resistive-ladder array --;
Line 24, after "2," insert -- the least significant portion of --;
Line 25, after "and", insert -- the most significant portion of the digital input signal comprising one or more --;
Line 27, after "bits", insert -- of the least significant portion --;
Line 33, after "bits", insert -- of the most significant portion --;
Line 46, delete "an" and insert therefor -- a first --;
Line 46, delete "first" and insert therefor -- least significant --;
Line 48, before "converting" insert -- without using the R-2R array, --;
Line 48, delete "second" and insert therefor -- most significant --;
Line 49, delete "an" and insert therefor -- a second --;
Line 50, delete "first" and insert therefor -- least significant --;
Line 52, after "bits", insert -- of the least significant portion --;
Line 54, delete "second" and insert therefor -- most significant --;
Line 55, after "bits", insert -- of the most significant portion --;

Column 8,
Line 16, delete "an" and insert therefor -- a --;
Line 17, delete first occurrence of "an" and insert therefor -- a --;
Line 17, delete second occurrence of "an" and insert therefor -- a first --;
Line 18, after "one" insert -- of --;
Line 19, delete "an" and insert therefor -- a second --;
Line 20, after "signal", insert -- without using the R-2R ladder --;

UNITED STATES PATENT AND TRADEMARK OFFICE
CERTIFICATE OF CORRECTION

PATENT NO. : 6,469,646 B1
DATED : October 22, 2002
INVENTOR(S) : Hongjiang Song

It is certified that error appears in the above-identified patent and that said Letters Patent is hereby corrected as shown below:

<u>Column 8 cont'd,</u>
Line 28, after "output signal", insert -- without using the resistive-ladder array --;
Line 35, delete "first" and insert therefor -- least significant --;
Line 37, delete "second" and insert therefor -- most significant --.

Signed and Sealed this

Fourth Day of February, 2003

JAMES E. ROGAN
*Director of the United States Patent and Trademark Office*